United States Patent
Boulant et al.

(10) Patent No.: US 10,459,056 B2
(45) Date of Patent: Oct. 29, 2019

(54) METHOD OF DESIGNING PULSE SEQUENCES FOR PARALLEL-TRANSMISSION MAGNETIC RESONANCE IMAGING, AND A METHOD OF PERFORMING MAGNETIC RESONANCE IMAGING USING SUCH SEQUENCES

(71) Applicant: COMMISSARIAT A L'ENERGIE ATOMIQUE ET AUX ENERGIES ALTERNATIVES, Paris (FR)

(72) Inventors: Nicolas Boulant, Saint Aubin (FR); Vincent Gras, Chevreuse (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 35 days.

(21) Appl. No.: 15/754,273

(22) PCT Filed: Sep. 28, 2016

(86) PCT No.: PCT/EP2016/073138
§ 371 (c)(1),
(2) Date: Feb. 21, 2018

(87) PCT Pub. No.: WO2017/060142
PCT Pub. Date: Apr. 13, 2017

(65) Prior Publication Data
US 2018/0252788 A1    Sep. 6, 2018

(30) Foreign Application Priority Data
Oct. 6, 2015   (EP) .................................... 15306569

(51) Int. Cl.
*G01R 33/561*   (2006.01)
*G01R 33/48*    (2006.01)
(Continued)

(52) U.S. Cl.
CPC ....... *G01R 33/5612* (2013.01); *G01R 33/246* (2013.01); *G01R 33/4822* (2013.01); *G01R 33/4833* (2013.01); *G01R 33/5659* (2013.01)

(58) Field of Classification Search
CPC .............. G01R 33/5612; G01R 33/246; G01R 33/4833; G01R 33/4822; G01R 33/5659
See application file for complete search history.

(56) References Cited

U.S. PATENT DOCUMENTS

| | | | |
|---|---|---|---|
| 7,847,554 B2 | 12/2010 | Nistler et al. | |
| 2011/0156704 A1* | 6/2011 | Boernert | G01R 33/3415 324/309 |

FOREIGN PATENT DOCUMENTS

| | | |
|---|---|---|
| WO | 2011/128847 A1 | 10/2011 |
| WO | 2011/144958 A1 | 11/2011 |

OTHER PUBLICATIONS

A. Tannus et al., "Adiabatic Pulses," NMR in Biomedicine, vol. 10, pp. 423-434 (1997).
(Continued)

*Primary Examiner* — G. M. A Hyder
(74) *Attorney, Agent, or Firm* — Baker & Hostetler LLP

(57) ABSTRACT

A method of designing a pulse sequence for parallel-transmission magnetic resonance imaging comprises: a) acquiring, for each member of a cohort, inhomogeneity maps of radio-frequency fields generated within the member; b) computing, for each member of the cohort, a spatial distribution of flip angles of nuclear spins obtained using the pulse sequences, and c) computing a single cost or merit function representative of a difference between the spatial distributions of flip angles and a target distribution, and iteratively adjusting design parameters of the pulse sequences to optimize the cost or merit function; the steps b) and c) being carried out iteratively using a computer. A method of performing parallel-transmission magnetic reso-
(Continued)

nance imaging on a subject using a pulse sequence designed by such a method is provided.

11 Claims, 5 Drawing Sheets

(51) Int. Cl.
*G01R 33/565* (2006.01)
*G01R 33/24* (2006.01)
*G01R 33/483* (2006.01)

(56) References Cited

OTHER PUBLICATIONS

Van de Moortele et al., "B1 destructive interferences and spatial phase patterns at 7 T with a head transceiver array coil," Magnetic Resonance in Medicine, vol. 54, pp. 1503-1518 (2005).
Ulrich Katscher et al., "Transmit SENSE," Magnetic Resonance in Medicine, vol. 49, pp. 144-150 (2003).
A. Hoyos-Idrobo et al., "On variant strategies to solve the Magnitude Least Squares optimization problem in parallel transmission RF pulse design and under strict SAR and power constraints," IEEE Transactions in Medical Imaging 2014; vol. 33, pp. 739-748.
B. Guérin et al., "Local specific absorption rate (SAR), global SAR, transmitter power, and excitation accuracy trade-offs in low flip-angle parallel transmit pulse design," Magnetic Resonance in Medicine 2014, vol. 71, pp. 1446-1457.
J. Lee et al., "Local SAR in Parallel Transmission Pulse Design," Magnetic Resonance in Medicine, vol. 67, 2012, pp. 1566-1578.
H-P. Fautz et al., "B1 mapping of coil arrays for parallel transmission," Proceedings of the 16th Annual Meeting of ISMRM, Canada, 2008, pp. 1247.
K. Nehrke et al., "DREAM—a novel approach for robust, ultrafast, multislice B1 mapping," Magnetic Resonance in Medicine, vol. 68, pp. 1515-1526 (2012).
M. A. Cloos et al., "kt points: Short three-dimensional tailored RF pulses for flip-angle homogenization over an extended volume," Magnetic Resonance in Medicine, vol. 67, pp. 72-80 (2012).
M. A. Cloos et al., "Dual-channel transmit-SENSE for flip-angle homogenization in the human brain at 7 Tesla: a feasibility study," Proc. Intl. Soc. Mag. Reson. Med. vol. 19 (2011).
Ma Chao et al., "Joint design of spoke trajectories and RF pulses for parallel excitation," Magnetic Resonance in Medicine, vol. 65, No. 4, Apr. 1, 2011, pp. 973-985.
K. Setsompop et al., "Magnitude least squares optimization for parallel radio frequency excitation design demonstrated at 7 Tesla with eight channels," Magnetic Resonance in Medicine, vol. 59, No. 4, Jan. 1, 2008, pp. 908-915, XP055264541.
V. Gras et al., "Universal pulses: a new concept for calibration-free parallel transmission," Magnetic Resonance in Medicine, vol. 77, No. 2, Feb. 17, 2016, pp. 635-643, XP055340677.
M. Davids et al., "Ultra-fast inner volume excitations with parallel transmission at 7 Tesla using fully optimized B)-robust k-space trajectories," 23rd Annual Meeting and Exhibition, Proceedings of the International Society for Magnetic Resonance in Medicine, No. 551, May 15, 2015, pp. 551, XP040666233.
J. P. Mugler III et al., "Three-Dimensional Magnetization-Prepared Rapid Gradient-Echo Imaging (3D MP RAGE)," Magnetic Resonance in Medicine, vol. 15, 1990, pp. 152-157.
D. Kelley, "Characterizing in vivo B1 Maps at 7T using the Kolmogorov-Smirnov Test," Proc. Intl. Soc. Magnetic Resonance in Medicine, vol. 23, 2015, pp. 2385.

\* cited by examiner

METHOD OF DESIGNING PULSE SEQUENCES FOR PARALLEL-TRANSMISSION MAGNETIC RESONANCE IMAGING, AND A METHOD OF PERFORMING MAGNETIC RESONANCE IMAGING USING SUCH SEQUENCES

CROSS-REFERENCE TO RELATED APPLICATIONS

This application is a National Stage of International patent application PCT/EP2016/073138, filed on Sep. 28, 2016, which claims priority to foreign European patent application No. EP 15306569.3, filed on Oct. 6, 2015, the disclosures of which are incorporated by reference in their entirety.

FIELD OF THE INVENTION

The invention relates to methods of designing pulse sequences for parallel-transmission magnetic resonance imaging and of performing parallel-transmission magnetic resonance imaging using such pulses. A pulse sequence comprises one or more radio-frequency (RF) pulses and at least one magnetic field gradient waveform, allowing manipulating the nuclear spins of a sample immersed in a static magnetic field.

BACKGROUND

One of the main purposes of ultra high field (UHF) magnetic resonance imaging (MRI), i.e. MRI using magnetic fields B0 of 7 T or more, is to improve spatial resolution, thanks to an increased signal-to-noise ratio (SNR). However, at UHF, the Larmor frequency of protons corresponds to wavelengths of a few centimeters or tens of centimeters, i.e. comparable to the size of anatomical features such as the head. This leads to enhanced non-uniformities in the radio-frequency (B1) field, and therefore to the appearance of low-SNR zone across the images, detrimental to diagnosis. Static magnetic field inhomogeneity ($\Delta B0$) induces similar problems.

Several tools have been proposed to solve this problem, including adiabatic pulses, RF shimming and parallel transmission.

Adiabatic pulses (see e.g. [1]) are amplitude and frequency modulated pulses, which effectively reduce B1 inhomogeneity as long as the field amplitude is above a certain threshold and that the pulse duration is sufficiently long. They have been a huge success at low field. However, their use is limited at ultra-high field because they necessitate long durations, large peak powers and large energies, thus large specific absorption rates (SAR, indicative of patient safety), which is problematic for in vivo studies.

RF shimming (see e.g. [2]) uses a plurality of radio-frequency (RF) coil elements, transmitting the same RF pulse with different complex weights, to homogenize the B1 field. As explained in [3], several sets of RF-shimming parameters—optimal for different categories of patient— may be pre-computed; during clinical activity, the best suited one of these sets of parameters is chosen for each given patient. This technique is attractive due to its simplicity, but in practice it only gives satisfactory results at UHF in very specific cases.

Transmit-sense parallel transmission, or "pTx", (see e.g. [4]) is a much more versatile technique, and so far has proved to be almost indispensable to tackle the RF and static field inhomogeneity problem at UHF for SAR-demanding sequences. This technique uses several independently-driven and spatially separated transmission channels, including respective coil elements placed around the subject, to simultaneously transmit RF pulses having different temporal waveforms (usually defined by complex envelopes). Moreover, a magnetic field gradient waveform, which defines a predetermined trajectory in k-space, is played at the same time as the RF pulses and/or between them. The complex envelopes of the RF pulses are designed to maximize the homogeneity of the nuclear spin excitation (i.e. flip angle) across a volume of interest, instead of homogenizing the field itself, as in RF shimming (in some particular case, the aim will be to obtain a flip-angle spatial distribution as close as possible to non-homogeneous target). The optimization of the RF pulses is usually carried out under local SAR constraints; see e.g. [5] and [6]. Document [7] discloses a method for simplifying the computational burden induced by the consideration of local SAR constraints.

Despite its effectiveness in homogenizing the nuclear spin excitation, parallel transmission has remained essentially a research instrument, and its use in clinical practice is still negligible twelve years after its introduction. This is mainly due to the fact that its implementation is difficult and laborious, as it starts with the acquisition of B1 and $\Delta B0$ maps for each patient (and, concerning B1, for each individual transmission channel), and follows with a numerical calculation performed on the fly (online)—when the subject is in the MRI scanner—to optimize the RF pulse depending on the measured B1 and $\Delta B0$ maps.

Even using the most effective available approaches, acquiring B1 and $\Delta B0$ maps ([7], [8]) takes at least 5-7 minutes, to which one must add the time required to perform the calculations for optimizing the pulses. While this duration is acceptable for research purposes, this may not be the case for the clinician who can hardly afford more than about 10 minutes to proceed with the clinically relevant acquisitions. Moreover, in addition to a lack of comfort, the patient can have a condition which hardly prevents him from moving (i.e. Parkinson's disease). Thus, the application field of pTx is limited today by the extra-time it requires.

SUMMARY OF THE INVENTION

The invention aims at overcoming this major drawback of pTx MRI. Albeit it applies mainly to UHF MRI, its applicability is not limited to this case. Indeed, in head imaging B1 inhomogeneities become very strong at about 7 T, but they may already be relevant at much lower fields (5 T or even 3 T) for some other body parts, such as the legs.

According to the invention, this aim is achieved by replacing "tailored" sequences of RF pulses and gradient waveforms, designed for a specific subject using B1 and $\Delta B0$ maps acquired on it, by "universal" sequences, optimized for a cohort, i.e. a representative sample of the population. The RF pulse and gradient waveform design can be performed with a variety of different metrics and methods, the point being that they are performed offline and jointly on the cohort, in order to make its action robust with respect to variations of the RF and $\Delta B0$ maps across subjects. As a refinement, it is possible to consider different cohorts, and therefore different "optimal" sequences, depending on morphological features of the subjects, e.g. the size of their heads. The proposed method hence renders the use of parallel transmission completely transparent to the user (the clinician), because the sequence design is performed offline. Most importantly, this method spares the user the time required for calibration and calculation.

Needless to say, sequences optimized and dedicated to a particular subject will always be more effective than the proposed universal sequences or pulses. However, as it will be demonstrated below, "universal" sequences designed according to the inventive method perform much better than a standard/blind approach, i.e. without parallel transmission, and the differences with a subject-based pulse design can be marginal and not worth the burden of measuring maps and calculating new RF pulses and new gradient waveforms. Interestingly, the invention applies both to small-angle excitation and to large-angle (FA greater or equal to 70° or even 90°) excitation, and even to inversion pulses (FA=180° or more).

It is worth noting that it had already been noticed that the RF (B1) and ΔB0 maps measured across the brain of several adult subjects do not appear to differ substantially, at least visually, despite different head sizes, sexes and anatomies. More recently, this observation has been confirmed by using sophisticated metrics [10]. However, these observations were made within the context of single channel RF transmission, where a single signal is sent to an electrical resonant structure generating a magnetic RF field inside the head. Therefore, it is not straightforward to draw conclusion concerning the much more complex case of pTx MRI, involving several spatially separated channels transmitting different complex RF waveforms, which thus interfere, and also a time-varying magnetic field gradient. Moreover, they only concern the magnitude of the RF field, rather than the resulting excitation (i.e. flip angle) spatial distribution.

The fact that a same k-space trajectory—and therefore a "universal" gradient waveform—can lead to a reasonably uniform spin excitation is particularly counterintuitive. Indeed, different subjects have different body (and particularly head) sizes and their relevant anatomical features are at slightly different positions. Therefore it would have been expected that the effectiveness of a gradient waveform is much more subject-dependent than the RF part of the excitation sequence.

Reference [14], describing a simplified parallel MRI protocol, using only two independent transmit channels, briefly mentions the possibility of using a single RF pulse for a small number of subjects. However, using universal gradient waveforms is neither disclosed nor suggested. Moreover, the teaching of this reference only concerns a very special case: dual-channel transmission and small-angle (5°) excitation.

Similarly, the "universal" sequences of the invention cannot be assimilated to the pre-computed set of calibration parameters used in RF shimming according to reference [3] because i) of the use of the gradient fields in the inventive method and ii) in RF shimming the set of calibration parameters is static, while the universal sequences involve different time-dependent waveforms Documents [15] and [17] disclose jointly optimizing RF pulses and k-space trajectories (i.e. gradient waveforms) for a single user.

Document [16] discloses a method of controlling a Magnetic Resonance Imaging apparatus by choosing one among a limited number of sets of control parameters.

An object of the present invention is a method of designing a pulse sequence for parallel-transmission magnetic resonance imaging, said pulse sequence comprising at least a magnetic field gradient waveform and a set of radio-frequency pulses, each pulse of said set being defined by a plurality of design parameters and being associated to a respective transmission channel of a parallel-transmission magnetic resonance imaging apparatus, the method comprising:

a) acquiring, for each member of a cohort of magnetic resonance imaging subjects, inhomogeneity maps of radio-frequency fields generated within said member by each of said transmission channels of said parallel-transmission magnetic resonance imaging apparatus;

b) computing, for each member of said cohort and by taking the corresponding inhomogeneity maps as inputs, a spatial distribution of flip angles of nuclear spins obtained by playing said radio-frequency pulses on the respective transmission channels while applying said magnetic field gradient waveform, and c) computing a single cost or merit function representative of a difference between at least a plurality of said spatial distributions of flip angles and a target distribution, and iteratively adjusting the design parameters of said radio-frequency pulses to optimize said cost or merit function;

said steps b) and c) being carried out iteratively using a computer.

Said gradient waveforms are also defined by a plurality of design parameters, step c) of the method further comprising adjusting the design parameters of said gradient waveform to optimize said cost or merit function.

Said cost or merit function may be chosen among: a normalized root mean square error of the nuclear spin flip angle, averaged on at least a plurality of members of said cohort, or its reciprocal; a normalized maximum root mean square error of the nuclear spin flip angle across the members of said cohort, or its reciprocal; and a monotone function thereof.

Said step may c) comprise iteratively adjusting said design parameters to optimize said cost or merit function under power constraints.

Said power constraints may include local SAR constraints.

Said step a) may further comprise acquiring, for each member of said cohort of magnetic resonance imaging subjects, an inhomogeneity map of a stating magnetic field within said member; and said step b) may further comprise taking said inhomogeneity maps as additional inputs for computing said spatial or statistical distributions of flip angles of nuclear spins.

The control parameters of said radio-frequency pulses may include temporal samples of an amplitude and a phase of each pulse.

The method may be applied to magnetic resonance imaging of human heads in a static magnetic field having amplitude of at least 3 T, preferably of at least 5 T and even more preferably of at least 7 T.

The method may be applied to high-flip angle excitation, i.e. said target distribution of flip angles may include, in a region of space, flip angles of at least 70°, and preferably of at least 90°.

Another object of the invention is a method of building a database of pulse sequences for parallel-transmission magnetic resonance imaging, the method comprising:

providing a plurality of magnetic resonance imaging subjects;

grouping said subjects into a plurality of cohorts according to at least one morphological feature; and for each of said cohorts, designing a respective pulse sequence by a method according to the invention.

Another object of the invention is a method of performing parallel-transmission magnetic resonance imaging of a subject using a pulse sequence designed by a method according to the invention, wherein the subject does not belong to the cohort considered for designing the pulses.

Yet another object of the invention is a method of performing parallel-transmission magnetic resonance imaging of a subject, comprising:

providing a database of pulse sequences, built according to the invention;

associating the subject to a cohort used for building said database on the basis of at least one morphological feature, a pulse sequence corresponding to said cohort; and performing parallel-transmission magnetic resonance imaging using said pulse sequence.

BRIEF DESCRIPTION OF THE DRAWINGS

Additional features and advantages of the present invention will become apparent from the subsequent description, taken in conjunction with the accompanying drawings, which show.

DETAILED DESCRIPTION

Figure 1:
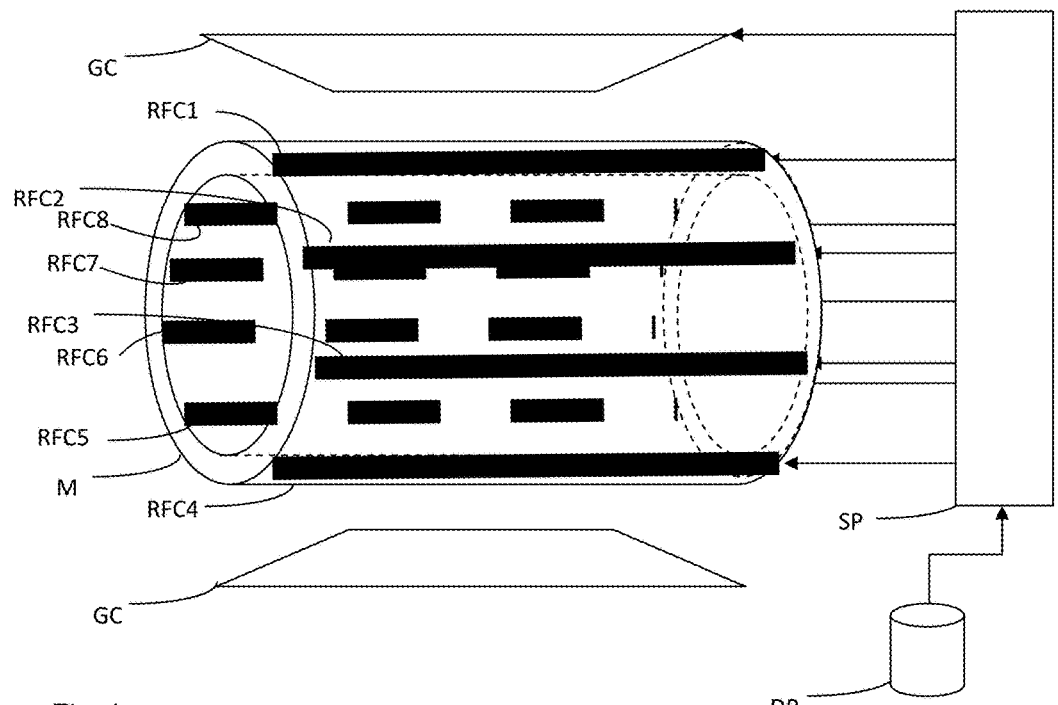
FIG. 1, a schematic representation of a parallel-transmission magnetic resonance apparatus suitable for carrying out the invention.

FIG. 1 is a very simplified representation of a parallel-transmission MRI scanner, suitable for carrying out the invention. Reference M designate a magnet for generating a strong (e.g. 7 T) static magnetic field B0 oriented along a "longitudinal" direction z which, in the case of FIG. 1, is horizontal. The magnet is cylindrical and hollow, to allow the insertion a subject (typically a human being) or of a body part thereof (e.g. the head). Additional magnets, called gradient coils (reference GC), are disposed outside the main magnet M and can be driven to generate slowly (i.e. not at radio-frequency) varying magnetic fields exhibiting intensity gradients along three orthogonal spatial dimensions. On the figure, only a pair of gradient coils is represented, allowing the generation of a gradient along a single spatial dimension. A plurality of radio-frequency coil elements are arranged at the periphery of the internal volume of the main coil M; in the example of FIG. 1 there are 8 of them: RFC1, RFC2, RFC3, RFC4, RFC5, RFC6, RFC7, RFC8. The coil elements are part of respective transmission channels, also including non-represented devices such as amplifiers, which are independently driven by a signal processor SP to emit respective RF pulses which, in general, have a same carrier frequency (at the Larmor frequency) and different, time-varying amplitudes and phases, which may be defined by a complex envelope. The signal processor also drives the gradient coils GC to generate gradient waveforms. The (non homogeneous) RF field B1 is generated by the RF coil elements; the ensemble formed by the RF coil elements is sometimes called a (RF) coil.

According to the invention, the complex envelopes of a set of RF pulses, comprising one pulse for each transmission channel of the scanner, may be stored in a database to which the signal processor SP has access. This set of pulses is "universal", meaning that it is designed—using the method that will be described below—to fit a large number of subjects, rather than being tailored for a specific subject as in the prior art. Advantageously, the database may also store "universal" gradient waveforms.

According to a particular embodiment of the invention, the database stores the envelopes of a plurality of sets of pulses and possibly a plurality of gradient waveforms (i.e. a plurality of different sequences), optimized for different classes of subjects clustered according to at least a morphological feature (e.g. people having different head sizes). One of these set of pulses/sequences is chosen to be played by the transmission channels of the scanner, depending on the relevant morphological features of the subject.

Figure 2:
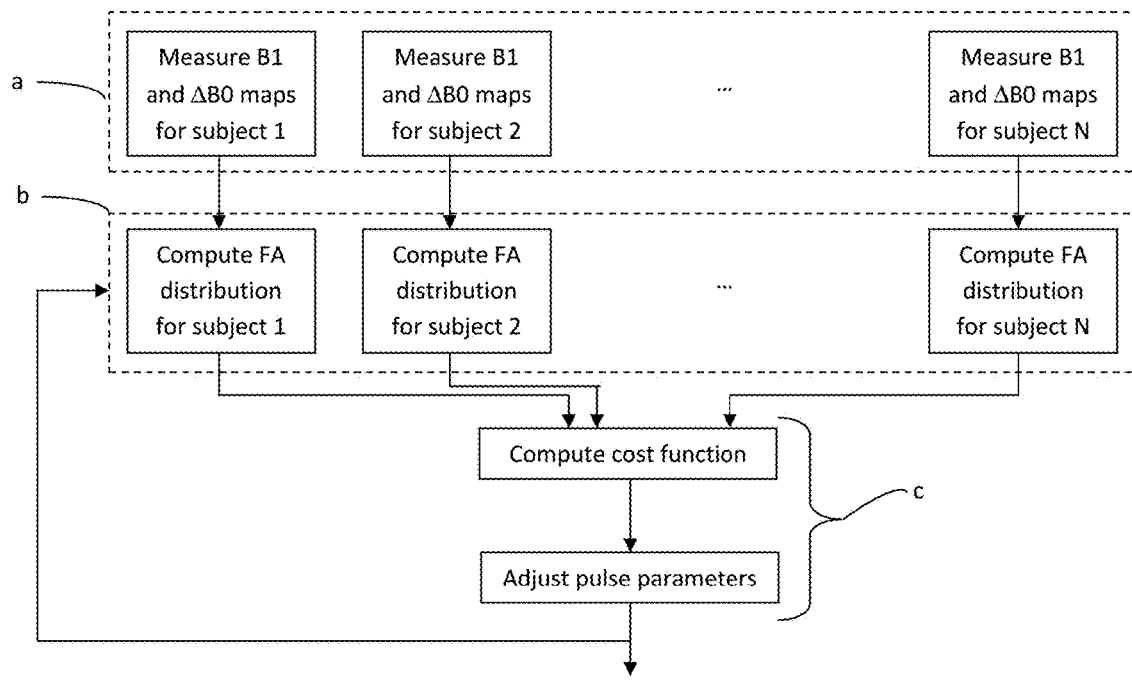
FIG. 2, a flow-chart of a method according to the invention.

FIG. 2 illustrates the steps of a method of designing MRI RF pulses according to an embodiment of the invention.

First of all, a plurality of subjects forming a cohort, i.e. a representative subset of a population of interest, is selected. For example, a cohort may be composed of adult people or, more specifically, of people whose head has a size within a predetermined range. The cohort should advantageously comprise at least 5, and preferably at least 10 subjects. In the following, N will designate the number—always greater than 1—of subjects forming the cohort. As mentioned above, in some embodiments several cohorts corresponding to different types or categories of subjects may be considered—e.g. a cohort of babies, one of children and one or more of adults with different morphological characteristics.

Then (step a) B1—and preferably also ΔB0—maps are acquired for each member of the cohort. Several methods are known in the art for carrying out this step, see e.g. [7], [8]. It is important to note that, for each member of the cohort, several B1 maps have to be acquired—one for each of the $N_c$ transmission channels of the scanner. Thus, if also ΔB0 maps are acquired, step a requires $N(N_c+1)$ independent measurements. This may require a significant time, but the measurements are performed "off-line", i.e. prior to the beginning of clinical examinations, and the members of the cohort may be healthy volunteers rather than patients.

Step b of the method involves computing the nuclear spins flip angles (FA) for the N members of the cohort.

A RF pulse may be defined by a finite number of design parameters. These may be temporal samples of the complex envelope, Fourier coefficients of said envelope, coefficients of an analytical expression etc. Moreover, a magnetic field gradient waveform is played alongside the RF pulses. In an embodiment of the invention, the magnetic field waveform is predefined and fixed, and only the design parameters of the RF pulses are adjusted to optimize the excitation homogeneity. In an alternative embodiment, both the RF pulses and the gradient waveform (and therefore the k-space trajectory) are optimized; therefore, the gradient waveform is also expressed using adjustable design parameters. For carrying out step b of the method for the first time, it is necessary to assign—e.g. randomly—initialization values to these design parameters.

Let us consider the case where nuclear spin excitation is performed non-selectively (i.e. over all the volume of interest) using the so-called "kT-points" technique [11] wherein gradient pulses define a broken line trajectory in k-space formed by (usually straight) segments linking discrete points (the "kT-points"), and wherein square RF sub-pulses are emitted in correspondence to said points (i.e. after each gradient pulse).

Let the volume of interest be decomposed into $N_v$ (e.g. $N_v$=12,000) voxels, each characterized by a respective value of the spin flip angle. Let $N_{kT}$ (e.g. $N_{kT}$=5) be the number of kT points, e.g. symmetrically located around the centre of the k-space; as each radio-frequency pulse is constituted by $N_{kT}$ square sub-pulses played at fixed times, its waveform can be defined by $N_{kT}$ complex amplitude values. Let $N_c$ (e.g. $N_c$=8) be the number of transmit channels, e.g. coil elements RFC1—RFC8 on FIG. 1.

In this case (see [5]), the flip angle can be expressed, in the small tip angle approximation, by:

$$FA = A \cdot x$$

where:

FA is a $N_v$-element column vector, whose elements represent the flip angle of respective voxels;

x is a p-element column vector, with $p=N_c \cdot N_{kT}$ obtained by concatenating the waveforms (each comprising $N_{kT}$ samples, see above) of the $N_c$ RF pulses forming a RF pulse set;

A is a $N_v \times p$ complex-coefficient matrix called the spin dynamics matrix, whose coefficients are given by:

$$a_{m,(j-1)N_c+n} = isB1_n(r_m)\exp(i\langle r_m, k_j\rangle)\exp\left(i\gamma\Delta B0(r_m)\left(T - \left(j - \frac{1}{2}\right)T_s\right)\right)$$

where:

"i" is the imaginary unit;

$r_m$ is the position vector of the m-th voxel;

$B1_n(r_m)$, expressed in µT (microteslas), is the B1 (radio-frequency) field generated, at maximum power, by the m-th channel at the m-th voxel; this is obtained during step a of the method;

j is the index of the kT-point, and $k_j$ the corresponding point in the k space, obtained by computing the time-reversed integral of the magnetic field gradients played during excitation;

$\langle .,. \rangle$ designates scalar product;

γ is the gyromagnetic ratio;

$\Delta B0(r_m)$, expressed in T (Teslas), is the inhomogeneity of the static magnetic field B0 at the m-th voxel; this is also obtained during step a of the method;

T is the total pulse duration;

$T_s$ is the duration of each RF sub-pulse—e.g. 0.08 ms for a target flip angle of 9° or 0.5 ms for a target flip angle of 180°;

Normalization constant s is the flip angle obtained for a sub-pulse of duration $T_s$ and with a RF amplitude of 1 µT.

The generalization to other kinds of pulse sequences is straightforward. Alternatively, if the flip angle is too large, the small tip angle approximation breaks down and a full numerical integration of the Bloch equation is necessary.

At the end of step b, N flip-angle maps—i.e. spatial distributions—are obtained, one for each subject of the cohort. These are used, in step c, to compute a "global" cost function, representative of the difference between all of said spatial or statistical distributions of flip angles (or at least a plurality of them) and a target distribution. In the simplest—and most common—case, the target corresponds to a uniform excitation of nuclear spins. In a preferred embodiment of the invention, the cost function may be obtained from the normalized root mean square errors (NRMSE) of the individual FA maps for the members of the cohort. For example, the cost function may be defined as the average NRMSE across the cohort, or the worst (i.e. highest) one, or a monotone function thereof. It is important to note that a cost function defined as—or depending on—the highest FA NRMSE across the cohort is representative of all the FA statistical distributions as it carries a relevant piece of information about all of them—i.e. that their NRMSE does not exceed its value.

Then, the design parameters of the RF pulses, and preferably of the gradient waveforms, are iteratively adjusted for minimizing the cost function, which involve re-computing the FA distributions for all the members of the cohort. As it is usual in the art of MRI, optimization is preferably carried out under power (peak power, average power, local SAR . . . ) constraints. As mentioned above, document [7] discloses an efficient method for imposing local SAR constraints.

Iterative optimization is carried out using conventional methods, e.g. active-set, and is stopped after a predetermined number of iterations or when a stopping condition is met (e.g. maximum NRMSE below a threshold value).

The RF pulses and the gradient waveforms obtained at the end of the iteration are robust, meaning that they are suitable to be used, with good results, for subjects not belonging to the cohort.

It will be easily understood that the cost function may be replaced by a merit function—e.g. the reciprocal of the maximum NRMSE—in which case the optimization consists in maximizing said merit function. The two approaches are perfectly equivalent.

The method was tested at NeuroSpin/CEA between March 2015 and July 2015. It made use of an 8 channels parallel transmission coil designed and built in the laboratory. The heads of six volunteers (5 men, 1 woman) were scanned at 7 T under identical conditions to acquire their respective B1 and ΔB0 maps. Their heights (weights) varied between 1.65 m (50 kg) and 1.85 m (106 kg). An active-set algorithm (described in [5]) was then applied offline to design two separate RF pulses: one inversion pulse (nominal value 180°) and one small flip angle pulse (nominal value 9°), so that they could be inserted in an MPRAGE sequence, which is a standard T1-weighted sequence aimed at providing anatomic details [13]. Both pulses were designed under explicit SAR and power constraints to make sure the waveforms were safe and could be played by the scanner. The pulses were non-selective and made use of the kT-points parameterization [11, 11 bis]. The k-space trajectories were also optimized simultaneously with the RF degrees of freedom, still using an active-set algorithm. The cost-function consisted of calculating the NRMSE for each subject in the database and taking among them the highest value (worst-case).

Figure 3:
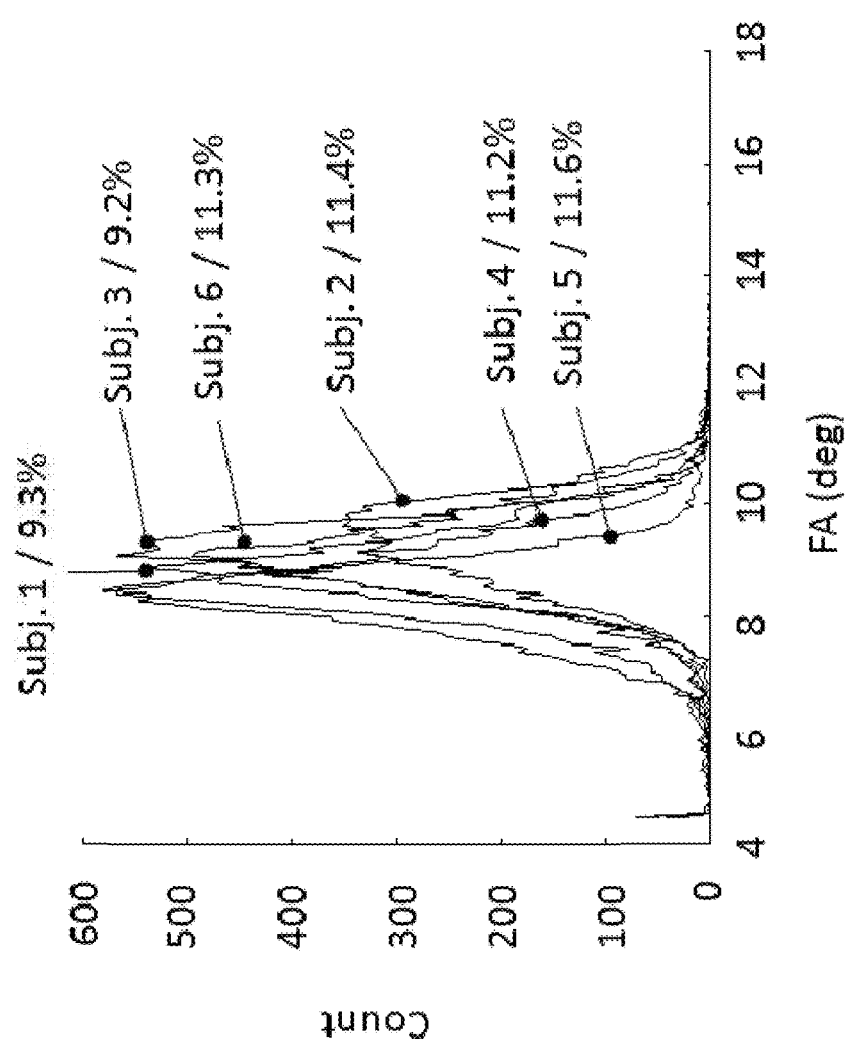
FIGS. 3 and 4, the flip angle histograms for six subjects forming a cohort, obtained using a same "universal" sequence, including a set of RF-pulses optimized for said cohort.
Figure 4:
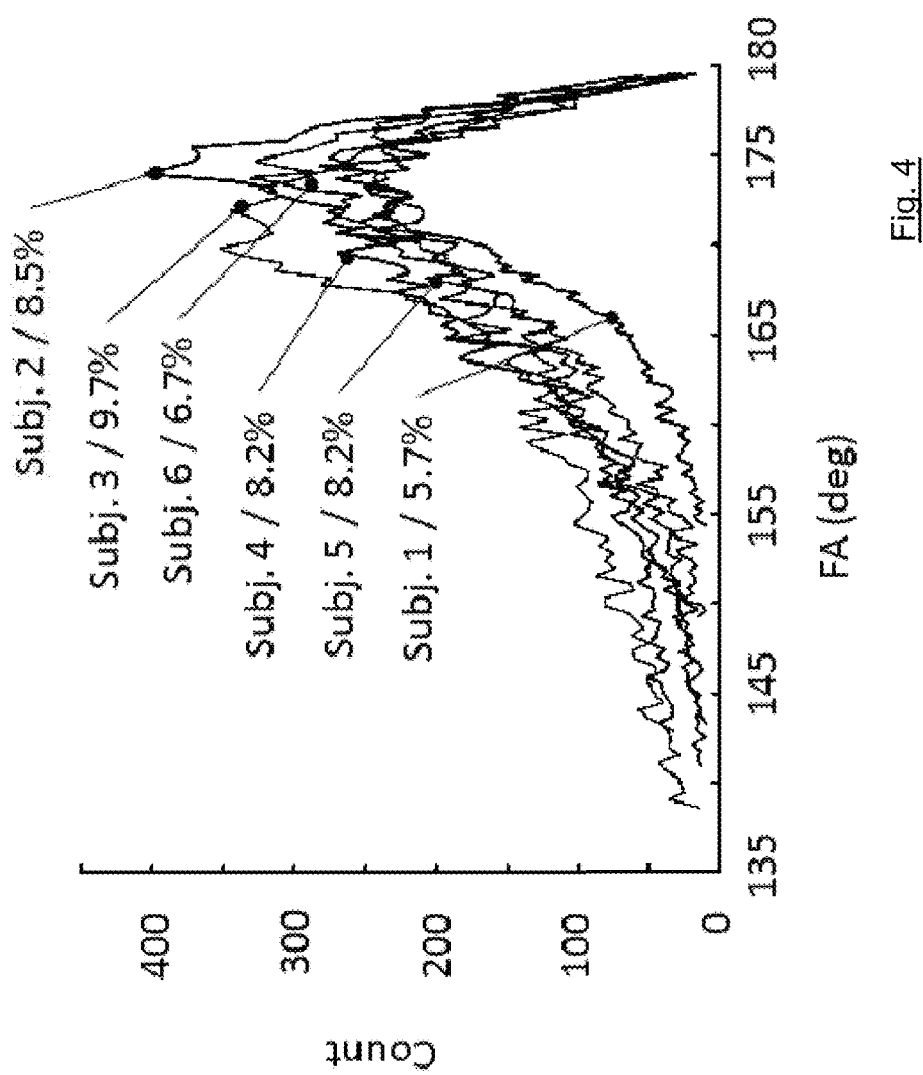

FIG. 3 and FIG. 4 show the calculated histograms of the small and large flip angle distributions respectively, throughout the brain, resulting from the application of a sequence based on a universal set of pulses. The algorithm was able to get roughly uniform performance across the six subjects (9.3%<NRMSE<11.6% for the small flip angle, 5.7%<NRMSE<9.7% for the large flip angle). Although the demonstration was carried out using the RF pulse design method based on the active-set technique [5], it could be applied with other methods, the point of the invention being to perform the calculations offline on a number subjects constituting a cohort, in order to return robust, subject-independent solutions.

Figure 5:
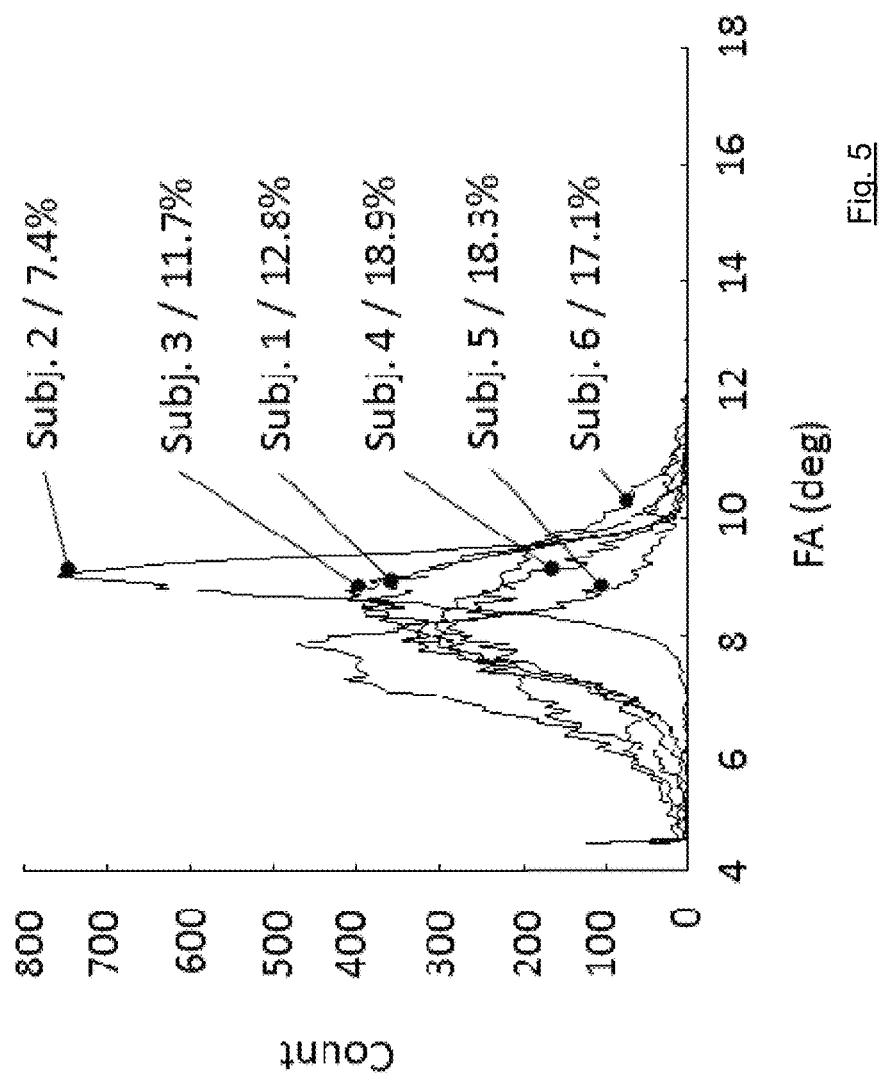
FIG. 5, the flip angle histograms for the six subjects forming the cohort, obtained using a same sequence, including a set of RF-pulses, optimized for one of the members of the cohort.

It is also worth pointing out that if the universal RF pulses and gradient waveforms were designed by taking into account only one subject in the cohort, they would not have worked that well on the other ones. This is illustrated on FIG. 5, showing FA histograms for the small flip angle case and for the six subjects using a set of pulses optimized for subject #2. As expected, the NRMSE on subject #2 is improved, but it is at the detriment of the NRMSE on the other subjects. The same phenomenon occurs in the large flip angle regime. The same figure also shows that a set of pulses tailored to one particular subject will always perform better than a universal set of pulses, which is not surprising. The gain, as demonstrated experimentally below, however can be marginal. For comparison with lower field strengths, 11.6% worst NRMSE (see FIG. 3) is already better than the inhomogeneity typically encountered in human brain MRI at 3 T (~13%), where RF inhomogeneity is not deemed a serious issue in head imaging.

Figure 6:
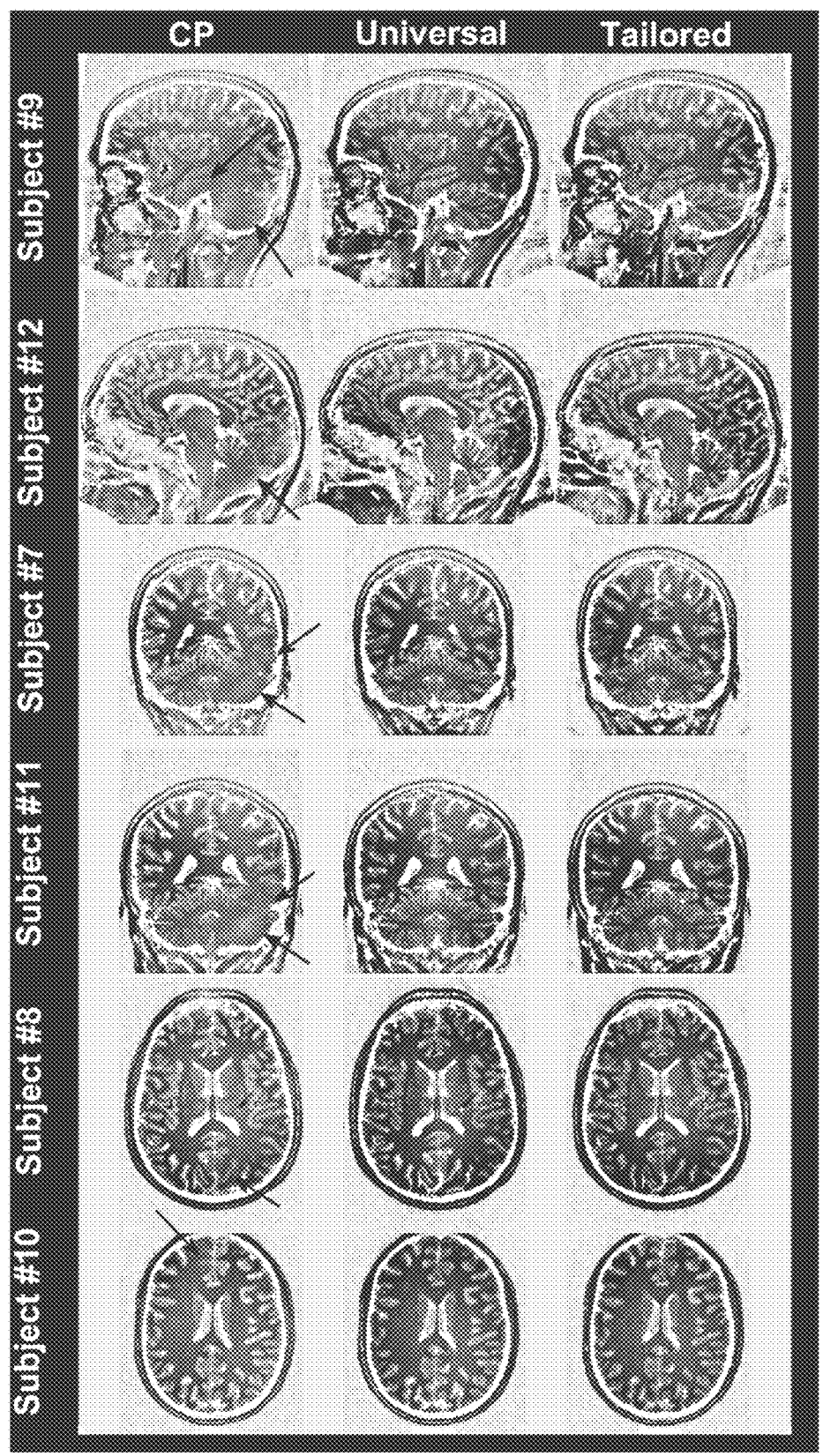
FIG. 6, parallel magnetic-resonance images (with inverted contrast) of the head of six subjects not belonging to the cohort, obtained by conventional (non pTx) MRI using circularly-polarized RF pulses, pTx using a "universal" sequence according to the invention and pTx using a sequence with "tailored" RF pulses according to the prior art.

Once the universal pulse set was designed to work robustly across all subjects contained in the database, it was applied on six additional subjects, #7 to #12 (4 men, 2 women, height: 1.69-1.80 m, weight: 54-82 kg), at the same 7 T field strength and using the same RF coil. The volunteers were inserted in the magnet and, for each of them, the MPRAGE sequence was implemented with the universal pulses, like in ordinary MRI routine exams not utilizing parallel transmission, i.e. without the knowledge of the specific B1 or ΔB0 maps. After that first sequence, the field maps were still acquired and fed to the optimization program in order to generate RF pulses optimized for each particular subject, and to compare the results. Lastly, a standard Circularly Polarized (CP) mode was applied to each subject to assess the technical advantage provided by the invention over the conventional approach used in clinical routine. Some of the results are reproduced on FIG. 6 (on these figures, contrast has been inverted for the sake of clarity). More precisely, sagittal slices are represented for subjects #9 and #12, axial slices for subjects #7 and #11 and coronal slices for subjects #8 and #10. Arrows indicate region where the CP pulse provide particularly unsatisfactorily results. It can be seen that the "universal" pulses perform much better than the CP pulses, and provide results which may be hard to distinguish from those obtained using "tailored" pulses. In particular, the contrast between gray and white matter is restored. The most noticeable differences are visible in the cerebellum, and temporal lobes.

REFERENCES

[1] A. Tannus, M. Garwood. "Adiabatic Pulses". NMR in biomedicine, Vol. 10, 423-434 (1997).
[2] Van de Moortele P F, Akgun C, Adriany G, Moeller S, Ritter J, Collins C M, Smith M B, Vaughan J T, Ugurbil K. "B1 destructive interferences and spatial phase patterns at 7 T with a head transceiver array coil" Magnetic Resonance in Medicine 54:1503-1518 (2005).
[3] U.S. Pat. No. 7,847,554
[4] Ulrich Katscher et al. "Transmit SENSE", Magnetic Resonance in Medicine 49:144-150 (2003)
[5] A. Hoyos-Idrobo et al. "On variant strategies to solve the Magnitude Least Squares optimization problem in parallel transmission RF pulse design and under strict SAR and power constraints" IEEE Transactions in Medical Imaging 2014; 33:739-748.
[6] B. Guérin et al. "Local specific absorption rate (SAR), global SAR, transmitter power, and excitation accuracy trade-offs in low flip-angle parallel transmit pulse design" Magnetic Resonance in Medicine 2014; 71:1446-1457.
[7] J. Lee et al. "Local SAR in Parallel Transmission Pulse Design" Magnetic Resonance in Medicine 2012; 67:1566-1578.
[8] H-P. Fautz et al. "B1 mapping of coil arrays for parallel transmission" in Proceedings of the 16th Annual Meeting of ISMRM, Toronto, Ontario, Canada, 2008. p. 1247.
[9] K. Nehrke et al. "DREAM-a novel approach for robust, ultrafast, multislice B1 mapping" Magnetic Resonance in Medicine 68:1515-1526 (2012).
[10] D. Kelley. "Characterizing in vivo B1 maps at 7 T using the Kolmogorov-Smirnov test" In: Proceedings of the 23rd annual meeting of the ISMRM, 2015, p 2385, Toronto, Canada.
[11] M. A. Cloos et al. "kt points: Short three-dimensional tailored RF pulses for flip-angle homogenization over an extended volume", Magnetic Resonance in Medicine 67:72-80 (2012).
[11 bis] WO2011128847
[12] WO2011144958
[13] J. P. Mugler et al. "Three-dimensional magnetization-prepared rapid gradient-echo imaging (3d MPRAGE)" Magnetic Resonance in Medicine 15:152-157 (1990).
[14] M. A. Cloos et al. «Dual-channel transmit-SENSE for flip-angle homogenization in the human brain at 7 Tesla: a feasibility study», Proc. Intl. Soc. Mag. Reson. Med. 19 (2011)
[15] M. Davids et al. "Ultra-fast inner volume excitations with parallel transmission at 7 Tesla using fully optimized B0-robust k-space trajectories", Proceedings of the 23rd Annual Meeting and Exhibition of the International Society for Magnetic Resonance in Medicin, ISMRM, Toronto, Canada, 30 May-5 Jun. 2015, page 551.
[16] US 2008/284432.
[17] Ma Chao et al. "Joint design of spoke trajectories and RF pulses for parallel excitation", Magnetic Resonance In Medicine, Vol. 65, no. 4, 1 Apr. 2011, pages 973-985.

The invention claimed is:

1. A method of designing a pulse sequence for parallel transmission magnetic resonance imaging, said pulse sequence comprising at least a magnetic field gradient waveform and a set of radio-frequency pulses, each pulse of said set and said or each said magnetic field gradient waveform being defined by a plurality of design parameters and being associated to a respective transmission channel (RFC1-RFC8) of a parallel-transmission magnetic resonance imaging apparatus, the method comprising:

a) acquiring, for each member of a cohort of magnetic resonance imaging subjects, and for each of said transmission channels of said parallel transmission magnetic resonance imaging apparatus, an inhomogeneity map of the radio-frequency field generated within said member by one said transmission channels;

b) computing, for each member of said cohort and by taking the corresponding inhomogeneity maps as inputs, a spatial distribution of flip angles of nuclear spins obtained by playing said radio-frequency pulses on the respective transmission channels (RFC1-RFC8) while applying said magnetic field gradient waveform; and c) computing a single cost or merit function representative of a difference between at least a plurality of said spatial distributions of flip angles and a target distribution of flip angles, and adjusting the design parameters of said radio-frequency pulses and of said gradient waveform to optimize said cost or merit function; said steps b) and c) being carried out iteratively using a computer.

2. The method according to claim 1 wherein said cost or merit function is chosen among:
   a normalized root mean square error of the nuclear spin flip angle, averaged on at least a plurality of members of said cohort, or its reciprocal;
   a normalized maximum root mean square error of the nuclear spin flip angle across the members of said cohort, or its reciprocal; and
   a monotone function thereof.

3. The method according to claim 1, wherein said step c) comprises iteratively adjusting said design parameters to optimize said cost or merit function under power constraints.

4. The method according to claim 3, wherein said power constraints include local SAR constraints.

5. The method according to claim 1, wherein said step a) further comprises acquiring, for each member of said cohort of magnetic resonance imaging subjects, an inhomogeneity map of a stating magnetic field within said member; and said step b) comprises taking said inhomogeneity maps as additional inputs for computing said spatial or statistical distributions of flip angles of nuclear spins.

6. The method according to claim 1, wherein the control parameters of said radio-frequency pulses include temporal samples of an amplitude and a phase of each pulse.

7. The method according to claim 1, applied to magnetic resonance imaging of human heads in a static magnetic field having amplitude of at least 3 T, preferably of at least 5 T and even more preferably of at least 7 T.

8. The method according to claim 1 wherein said target distribution of flip angles includes, in a region of space, flip angles of at least 70°.

9. A method of building a database of pulse sequences for parallel-transmission magnetic resonance imaging, the method comprising:
   providing a plurality of magnetic resonance imaging subjects;
   grouping said subjects into a plurality of cohorts according to at least one morphological feature; and
   for each of said cohorts, designing a respective pulse sequence and a respective gradient waveform by a method according to claim 1.

10. The method of performing parallel-transmission magnetic resonance imaging of a subject, comprising:
    providing a database (DB) of pulse sequences and gradient waveforms, built using a method according to claim 9;
    associating the subject to a cohort used for building said database on the basis of at least one morphological feature, a pulse sequence corresponding to said cohort; and
    performing parallel-transmission magnetic resonance imaging using said pulse sequence;
    wherein the method does not comprise a step of acquiring inhomogeneity maps for the subject and using them for designing the pulse sequence and the gradient waveform.

11. A method of performing parallel-transmission magnetic resonance imaging of a subject using a pulse sequence and a gradient waveform designed by a method according to claim 1, wherein the subject does not belong to the cohort considered for designing the pulse sequence and the gradient waveform, and wherein the method does not comprise a step of acquiring inhomogeneity maps for the subject and using them for designing the pulse sequence and the gradient waveform.

* * * * *